(12) United States Patent
Krauss

(10) Patent No.: US 7,893,518 B2
(45) Date of Patent: Feb. 22, 2011

(54) METHOD FOR GENERATING A LAYOUT, USE OF A TRANSISTOR LAYOUT, AND SEMICONDUCTOR CIRCUIT

(75) Inventor: Martin Krauss, Obersulm (DE)

(73) Assignee: Atmel Automotive GmbH, Heilbronn (DE)

( * ) Notice: Subject to any disclaimer, the term of this patent is extended or adjusted under 35 U.S.C. 154(b) by 223 days.

(21) Appl. No.: 12/111,181

(22) Filed: Apr. 28, 2008

(65) Prior Publication Data

US 2008/0265361 A1  Oct. 30, 2008

Related U.S. Application Data

(60) Provisional application No. 60/924,019, filed on Apr. 26, 2007.

(30) Foreign Application Priority Data

Apr. 27, 2007  (DE) .................. 10 2007 019 940

(51) Int. Cl.
*H01L 23/52*  (2006.01)

(52) U.S. Cl. .................. 257/503; 257/E29.001; 257/E27.105

(58) Field of Classification Search ................ 257/503, 257/E29.001, E27.105
See application file for complete search history.

(56) References Cited

U.S. PATENT DOCUMENTS

| 4,689,654 | A | 8/1987 | Brockmann | |
|---|---|---|---|---|
| H512 | H * | 8/1988 | Borgini et al. | 257/369 |
| 5,017,919 | A | 5/1991 | Hull et al. | |
| 5,952,698 | A | 9/1999 | Wong et al. | |
| 6,271,548 | B1 | 8/2001 | Umemoto et al. | |
| 6,329,260 | B1 * | 12/2001 | DeJong et al. | 438/318 |
| 2002/0040986 | A1 | 4/2002 | Sugiyama et al. | |
| 2003/0227402 | A1 | 12/2003 | Starzyk et al. | |
| 2005/0224982 | A1 | 10/2005 | Kemerling et al. | |
| 2006/0026547 | A1 | 2/2006 | Aggarwal | |
| 2006/0090146 | A1 | 4/2006 | LeBritton et al. | |

FOREIGN PATENT DOCUMENTS

DE  3514266 A1  10/1986

OTHER PUBLICATIONS

Tuinhout et al., "Test Structures for investigation of Metal Coverage Effects on Mosfet Matching", Proceedings IEEE 1997 International Conference on Microelectronic Test Structures, vol. 10, Mar. 1997, pp. 179-183.

(Continued)

*Primary Examiner*—Trung Dang
(74) *Attorney, Agent, or Firm*—Muncy, Geissler, Olds, Lowe, PLLC

(57) ABSTRACT

A method for generating a layout, use of a transistor layout, and semiconductor circuit is provided that includes a matching structure, which has a number of transistors, whose structure is similar to one another, metallization levels with geometrically formed traces, which are formed directly above the transistors, and vias (in via levels), which are formed between two of the metallization levels. Whereby, within one and the same metallization level, the geometry of the traces above each transistor is formed the same.

8 Claims, 10 Drawing Sheets

OTHER PUBLICATIONS

Lowe, Anton: "Impact of metallisation on resistor maching in a 0.35 µm analogue CMOS process", Solid State Electronics, Elsevier Science Publishers, Barking, GB, vol. 48, Nr. 5, pp. 697-704, 2004.

Tuinhout et al., "Current mirror test structures for studying adjacent layout effects on systematic transistor Mismatch", Proceedings of the 2003 International Conference on Microelectronic Test Structures, Monterey, CA, Mar. 17, 2003, pp: 221-226.

* cited by examiner

METHOD FOR GENERATING A LAYOUT, USE OF A TRANSISTOR LAYOUT, AND SEMICONDUCTOR CIRCUIT

This nonprovisional application claims priority to German Patent Application No. DE 10 2007 019 940.8, which was filed in Germany on Apr. 27, 2007, and to U.S. Provisional Application No. 60/924,019, which was filed on Apr. 26, 2007, and which are both herein incorporated by reference.

BACKGROUND OF THE INVENTION

1. Field of the Invention

The present invention relates to a method for generating a layout, use of a transistor layout, and a semiconductor circuit.

2. Description of the Background Art

In the design (layout) for the production of semiconductor components, computer-aided design environments are used today, which provide basic elements, such as transistors, resistors, etc., in a component level as variable cells (generators). To achieve as many degrees of freedom as possible in the wiring of these elements, they are equipped only with terminals for the lowest metallization level. For this purpose, contacts are provided between the elements and the lowest metallization level. These contacts can be regarded as connecting elements of a contact level. U.S. Patent Application No. 2005/0224982 A1 discloses a via configurable architecture of a semiconductor circuit for application-specific analog circuitry. U.S. Patent Application No. 2002/0040986 A1 discloses a semiconductor circuit with a dummy structure. Unexamined German Patent Application No. DE 35 14 266 A1 discloses a component for generating integrated circuits. This component has a trace field with traces crossing in a lattice manner.

Furthermore, during the design and in the practical realization of semiconductor components, such as, for example, the input stage of an amplifier or a digital-to-analog converter (DAC), so-called matching requirements must be routinely fulfilled, which are to assure that the individual pathways of the produced semiconductor component behave similarly to one another electrically, i.e., in a signaling manner. Such matching requirements are realized by matching structures, which are also called pairing structures. In this regard, such assembled semiconductor components in practice are routinely generated in a field of identical (semiconductor) elements, which are arranged on a wafer distributed around a mutual center, to equalize possible gradients, which arise due to process tolerances along the surface. Advantageously, the individual elements are dimensioned relatively large. Gradients of this type are generally local differences between electrical parameters, such as a voltage, which may have many possible causes. Examples here are: inhomogeneities of process parameters (layer thicknesses, doping, etc.), mechanical stress, uneven heat distribution during operation, and the like.

SUMMARY OF THE INVENTION

It is therefore an object of the invention to provide a semiconductor circuit with a matching structure is provided. The semiconductor circuit can also be called a semiconductor component. The matching structure can also be called a pairing structure. The matching structure has a number of transistors, whose structure is similar. The structure of the transistors thereby has semiconductor regions and insulator regions necessary for the function of the transistor. Preferably, the transistors are field-effect transistors with a source, drain, body, and gate electrode, for example, of doped silicon. Within the scope of fabrication tolerances, the transistors are similar relative to their structure and their electrical properties. The transistors are usually not identical in the atomic dimension, however.

Furthermore, the semiconductor circuit can have metallization levels with geometrically formed traces. The geometrically formed traces in this case are formed directly above the transistors. Thus, in an embodiment, no additional conductors in a level in-between are arranged between the geometrically formed traces and the transistors. The traces are preferably metallic conductors. Alternatively, doped semiconductor material can be used as a trace.

Furthermore, the semiconductor circuit has vias in via levels. The vias are formed between two each of the metallization levels. A via, in this case, is an opening filled with a conducting material in an insulator layer of the via level. Depending on the position of the via, a current flow perpendicular to the chip surface can be made possible advantageously with the via. To this end, the via preferably adjoins a first trace in the adjacent metallization level above the via and a second trace in the adjacent metallization level below the via.

Within one and the same metallization level, the geometry of the traces above each transistor of the matching structure is formed the same. In contrast, the geometry of the traces above one and the same transistor can be different from metallization level to metallization level. Preferably, the geometry in at least four metallization levels—which are formed directly above the transistors of the matching structure—is formed the same. The uniformity in this case can be generated, for example, by means of masking during the manufacturing process within the scope of specified fabrication tolerances.

Furthermore, another object of the invention is to provide a method for generating the layout. Accordingly, a method for generating a layout of a semiconductor circuit is provided. A number of hierarchical stages are preferably provided for this purpose. A sequence of process steps for generating the layout can thereby deviate from a later production sequence. The semiconductor circuit thereby has a matching structure with transistors. In this case, a similar structure of the transistors of the matching structure is generated.

As part of the layout, traces as layout elements are geometrically defined in metallization levels directly above the transistors and arranged in a position. For this purpose, suitable geometries are formed, which can be transferred in a later manufacturing process, for example, to masking. For example, each metallization level is assigned a layout layer for this metallization level.

As part of the layout, furthermore, vias are arranged in via levels between two metallization levels. The position of the vias is defined thereby in the layout.

Within one and the same metallization level, the trace geometry defined in the layout above each transistor is formed the same.

Another object of the invention is to provide a use of trace geometries. Accordingly, the use of a transistor layout of a matching structure in a layout generating process is provided. The transistor layout in this case has not only the contacting of a relevant transistor, but also traces formed over the transistor. The transistor layout in this case has invariable geometries of traces in several metallization levels formed directly above the transistor. The trace geometries are positioned for constructing the transistor. Preferably, the trace geometries overlap in part in an adjacent arrangement of the transistor layout.

Another aspect of the invention is the use of trace geometries to generate parasitic capacitors. The traces are formed in different metallization levels directly above transistors of a matching structure of a semiconductor circuit. The parasitic capacitors are similar for each transistor of the matching structure, in that within one and the same metallization level the trace geometry above each transistor is formed the same.

The embodiments described hereafter relate both to the semiconductor circuit and to the use of trace geometries, as well as to the method for generating a semiconductor circuit layout.

According to an embodiment, the transistors of the matching structure can be arranged adjacent to one another in the layout and on the chip. If the transistors are arranged, for example, in a matrix with rows and columns, each single transistor, formed as a rectangle or square, for example, has a maximum of four transistors at its sides and a maximum of four other neighboring transistors displaced diagonally at its corners. If the transistor is formed as a hexagon, it accordingly has a maximum of six adjacent transistors.

Preferably, within one and the same metallization level, at least one trace of the geometry above a transistor (the transistors of the matching structure) adjoins at least one trace of an adjacent transistor (the transistors of the matching structure) to form a conducting connection. In the layout, the conducting connection is achieved by a minimum overlapping of the trace geometries of adjacent transistors.

According to an embodiment, at least within the lowest via level the position of the vias can be the same relative to the structure of each transistor. Preferably, the contacts in a contact level between the lowest metallization level and the transistors are also formed the same.

In an embodiment, it is provided that in the third via level or in a via level above the third via level the position of the vias relative to the structure of each transistor—particularly for connecting the transistors to one another—can be different. After the positioning of the transistors of the matching structure together with the trace geometries of the metallization levels, connections of the transistors of the matching structure are formed advantageously by the positioning of vias, for example, in the third via level, preferably, however, in the uppermost via level. The transistors can be connected to one another by these connections.

According to an embodiment, the trace geometry within at least one metallization level can have a plurality of strips parallel to one another. Preferably, the parallel strips are arranged at an equidistant spacing to one another. Preferably, the strips extend over the predominant part of the dimensions of the transistor. Preferably, the strips are used for the electrical connection or alternatively are connected to a reference potential, for example, ground. It is also possible to realize a shielding function by the strips.

In an embodiment, the matching structure has dummy transistors. The dummy transistors have a structure that resembles that of the transistors. Advantageously, the dummy transistors are arranged in the layout with the same geometry as the active transistors but not connected functionally as a transistor; rather, for example, they are connected to a reference potential, such as ground, a supply voltage, or the like. Preferably, the dummy transistors are arranged at the edge of the matching structure. Preferably, the transistors are completely surrounded by dummy transistors, for example, in the form of a rectangle or square. Within one and the same metallization level, the geometry of the traces above each transistor and each dummy transistor is preferably formed the same.

It is provided in a embodiment that filling structures can be automatically arranged only outside the matching structure between traces of the metallization levels. Filling structures of this type are advantageously structures made of the same material and in the same process steps as those of the traces. For example, these are metal strips, which are automatically positioned by a computer program and are not connected and therefore float. The filling structures are required when a planarization step, which requires a ratio of trace area to free area that is not covered by traces, is planned between the formation of the metallization levels during the manufacturing process.

According to an embodiment, it is provided therefore that at least within one and the same metallization level outside the matching structure a first coverage ratio of traces and filling structures to the free areas and a second coverage ratio of the trace geometry to the free areas of the matching structure are within one and the same value range. The value range is advantageously between 30% and 70% for the coverage ratio.

In an embodiment, each transistor of the matching structure is positioned as a module with invariable trace geometries in the metallization levels. Preferably, each transistor is positioned adjacent to at least one other transistor of the matching structure, whereby the geometries advantageously overlap in part. A module is to be understood in this case to be the transistor with its structure together with the geometry of the traces in the particular metallization level, so that the traces of the metallization levels cannot be changed. Preferably, only the position of the vias can be changed. Especially preferably, only the vias of the uppermost via level can be placed in their position, preferably in a hierarchical level of the layout generation different from the modules.

Preferably a metal structure with a number of connecting lines is substantially applied totally as the trace geometry. Optional connections between the connecting lines of the metal structure are to be applied to create the semiconductor circuit, also called a semiconductor component. In particular, this occurs depending on a position of the transistor as a semiconductor element in a field on the chip.

It is provided according to an embodiment that after positioning of the transistors of the matching structure and optionally additional layout generation steps, between traces of the metallization levels, filling structures are automatically arranged, whereby the automatic arrangement of filling structures is deactivated within the area of the matching structure.

Preferably, the matching structure is arranged within a field on the chip. Advantageously, the transistors are generated by means of an arrangement of semiconductor and isolation layers. Advantageously, the semiconductor layers are electrically contacted via the traces, particularly via a metal structure, and connected to form the semiconductor circuit.

Advantageously, the traces can have a number of connecting lines. Advantageously, the connecting lines of the transistors are connected by means of vias between connecting lines of the respective trace. Preferably, the connecting lines or the traces in this case cover a portion, particularly 30-70%, of the surface area of the transistor.

Connecting lines of the traces can be positioned within a metallization level in such a way that these connecting lines extend over several transistors arranged next to each other. For example, a connecting line extends over an entire row or column of transistors. Other traces, which are not to be connected particularly to connecting devices for the transistor, can be connected advantageously to a shielding and/or reference potential.

Also, the transistors of the matching structure can be arranged in a matrix with rows and columns row by row and/or column by column. Advantageously, the transistors are connected to form the matching structure. Advantageously, to generate the transistors from several single transistors connected in parallel, the transistors of a row and/or column are arranged interchanged, particularly permuted, in their sequence compared with the transistors of another row or column.

Another aspect of the invention is a semifinished product for manufacturing at least one semiconductor circuit. Another aspect of the invention is a computer-implemented method for generating a layout according to any one of the previous embodiments. Another aspect is a data carrier with a software program for generating a layout according to any one of the previous embodiments. Another aspect of the invention is a data carrier with layout data for a previously specified matching structure.

Within the context of an embodiment of the present invention, a transistor to be generated as a semiconductor component is formed in a field on the chip with a number of cells, whereby each cell contains a single transistor and in addition the specifically overlying metallization and via levels (connection levels). The aforementioned metallization levels, which advantageously in each case represent traces, for example, metal structures, with a number of connecting lines, are preferably patterned so that they have the necessary, particularly metallic area coverage for each cell and are used advantageously for connecting the single transistor or for supplying of the appropriate connecting networks (inputs, outputs, or the like) or for shielding of the individual elements.

Thus a field having such cells advantageously represents—after its practical realization—a semifinished product for the manufacture of at least one semiconductor component, which apart from the aforementioned terminals, each of which depend on a position of the individual element in the field, is predominantly wired. Preferably, the missing connections for connecting the relevant networks are then realized at connecting points optionally provided therefor, preferably by vias (vertical interconnect access), particularly on a new, higher hierarchical level of the layout. Preferably, the metal structures for elements, particularly transistors, of a group, connected together to create a matching structure, are formed the same to meet predefined matching requirements.

Advantageously, in the (layout) method the transistor used to form the matching structure as a semiconductor element already contains the overlying wiring portion in several, for example, all metal levels (METx; x=1, 2, . . . ), with consideration of the required electrical and technical process boundary conditions. This is preferably achieved by an additional hierarchical level or cell, which according to the invention contains both the basic element (the transistor), provided originally by the design environment, and the overlying traces, for example, as metal structures.

The method of the invention is notable in regard to a hierarchy in the layout generation in that in the otherwise typical wiring level, at which the individual elements are called upon and connected together to form the matching structure, traces are no longer to be designed. Only a small remainder of connections, which are determined by the position of the elements in the field, are advantageously made at the respectively prepared locations of the particular element by the placement of vias.

Further, an additional (layout) hierarchical level can be provided, in which previously applied geometric traces, for example, as metal structures, which assure at least in this regard a topographic uniformity of all elements of the field, and then depending on the position of the individual elements in the field are connected for purposes of wiring; it can be used not only in the design of matching structures but also practically in the manufacture or fabrication thereof advantageously in a semiconductor circuit, in that the manufacture occurs preferably with use of a layout generated according to the invention.

A preferred use of the method is in the field of layout, for example, as a suitable function in software-based and computer-aided planning and design of semiconductor circuits as semiconductor components, which is not provided by so-called EDA tools used conventionally for this purpose.

The direct relationship of layout and "schematic" is lost (important in the context of SDL—schematic driven layout) by the additional hierarchical level, which is necessary according to certain embodiments of the invention particularly for the formation of a matching structure. The method is thereby part of a manufacturing process for semiconductor circuits.

The corresponding fabrication of the silicon wafer proceeds principally in a conventional manner—in the present case, however, by using the masks produced by means of the generated layout data.

There is also the possibility to fully process wafers with the exception of the uppermost metallization and via level, which are used to create optional and particularly position-dependent connections between connecting lines of a semiconductor element and then to leave them (unfinished) as a semifinished product. Semiconductor components or elements on this wafer can then be influenced by the still remaining (connection) process steps in their later electrical function or their electrical parameters.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
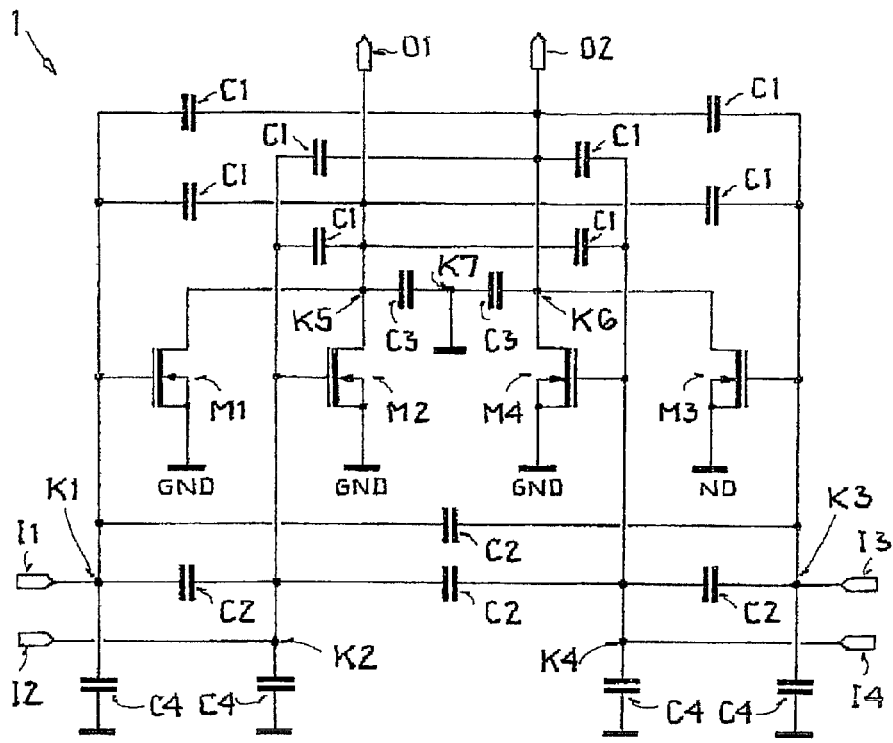
FIG. 1 shows a wiring diagram of the input stage of an amplifier, which represents a semiconductor circuit as a semiconductor component within the meaning of the present invention, with drawn parasitic capacitors.

FIG. 1 shows input stage 1 of an amplifier, not shown in greater detail, as a semiconductor circuit. Input stage 1 has semiconductor elements in the form of first to fourth field-effect transistors (MOSFETs) M1-M4, inputs I1-I4, and outputs O1-O2 and is used in the present case only as a possible example for a semiconductor circuit, which is also called a monolithically integrated semiconductor component hereafter. The semiconductor circuit has a matching structure, which has a number of similar transistors M1-M4 as semiconductor elements. In the present case, transistors M1-M4 are made identical with a channel width W=30μ, a channel length L=20μ, and m=4 (i.e., there are four transistors connected in parallel). Source and bulk terminals of transistors M1-M4 are at ground potential GND. Gate terminals of transistors M1-M4 are connected via nodes K1-K4 in each case to a respective input I1-I4. Drain terminals of transistors M1 and M2 are routed to a mutual node K5, whereas drain terminals of transistors M3 and M4 are routed to a mutual node K6. A node K7, lying between nodes K5 and K6, is connected to ground potential GND. Node K5 is connected to a first output O1 and node K6 to a second output O2 of input stage 1.

Because input stage 1—as mentioned—is made as a semiconductor component, during the practical realization a series of parasitic capacitors C1-C4 results between substructures of input stage 1, particularly between the aforementioned nodes K1-K7. By way of example, reference is made to parasitic capacitors C4, which in each case are present at nodes K1-K4. There are parasitic capacitors C2 between the node pairs K1/K2, K2/K4, K3/K4, and K1/K3. There are parasitic capacitors C3 between node K7 and node K5 or K6. There are additional parasitic capacitors C1 in each case between the gate terminal of transistors M1-M4 and output O1 or O2.

When a semiconductor component, such as input stage 1 according to FIG. 1, based on the semiconductor elements/transistors M1-M4, is to be realized as layout or physically or is to be wired, it must be kept in mind that the individual electrical (signal) paths of the finished semiconductor component substantially match (pair) each other in regard to a particular electric parameter. It can be required in this case that the matching occurs in relation to the aforementioned parameter<0.1%. In other words: Semiconductor elements M1-M4 and inputs and outputs I1-I4, O1-O2 are to be connected to one another in such a way that the largest possible matching of the individual (signal) paths results. For this purpose, the matching (symmetry) of the previously described possible parasitic capacitors C1-C4, drawn in addition in FIG. 1, is necessary for dynamic reasons. This applies in particular to capacitor C1. Moreover, in the case of the shown exemplary embodiment of FIG. 1, it is necessary that parasitic capacitors C1 and C1 are as small as possible.

In this regard, the presented exemplary embodiment provides for the construction of the semiconductor component to be realized, in the present case therefore input stage 1 according to FIG. 1, as an arrangement of similar cells, i.e., identical based on type, which contains a single semiconductor element (or single element) in each case and all geometrically formed traces necessary for wiring in metallization levels. Preferably, it contains furthermore vias of at least one via level. Within one and the same metallization level, the geometry of the traces above each transistor M1-M4 is formed the same. For the present exemplary embodiment, the topological patterning of the metallization levels and via levels is shown in FIG. 2.

Figure 2:
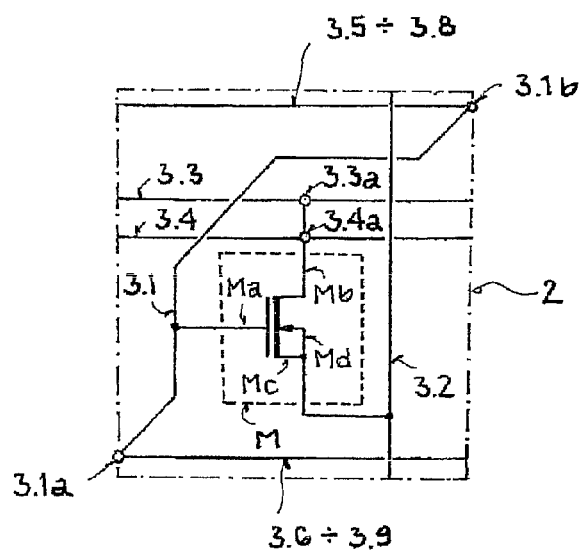
FIG. 2 shows a topological scheme of the routing in a cell, which contains a transistor as a single semiconductor element for the semiconductor component in FIG. 1.

FIG. 2 shows a topological scheme of the routing in a cell 2, which contains a single semiconductor element M—here a field-effect transistor. The dash-dot border in FIG. 2 represents the boundary of cell 2, which contains the single semiconductor element M in the form of a transistor and the overlying conduction levels, which accordingly represent traces in several metallization levels with a number of connecting lines (solid lines in FIG. 2). The open circles in FIG. 2 represent optional terminals. These are locations in the topology at which the creation of connections between the metallization levels or connecting lines by means of respective vias is optionally provided.

The topological scheme according to FIG. 2 is explained in greater detail hereinafter:

The semiconductor element M corresponds to transistors M1-M4 in FIG. 1. It has a gate terminal Ma, a drain terminal Mb, and source and bulk terminals Mc, Md connected to one another. The connecting lines or connections described hereinafter were all projected in FIG. 2 onto the (dash-dot bounded) area of cell 2. Cell 2 with transistor M and with connections 3.1 to 3.9 is preferably prepared as a finished module in a program library for generating a layout.

The gate terminal Ma of transistor M is connected to a first connecting line 3.1, which extends substantially diagonally over cell 2. The first connecting line 3.1 has at its ends optional terminals 3.1a, 3.1b; i.e., it can be connected at these places with the overlying or underlying connecting lines by means of vias. Furthermore, cell 2 comprises a second connecting line 3.2, extending vertically in the selected illustration, which is connected to the source and bulk terminals Mc, Md of transistor M. The second connecting line 3.2 has no optional terminals at its ends, i.e., at the cell border. In the present case, this means that the second connecting line 3.2 continues beyond the cell border into an adjacent similar cell (not shown), without the creation of a separate connection being necessary for this.

This also applies to the horizontally extending third and fourth connecting lines 3.3, 3.4 and to the diagonal connecting line 3.1. The former can be connected in addition via optional terminals 3.3a or 3.4a to the drain terminal Mb of transistor M, as described heretofore for the first connecting line 3.1. At the top and bottom cell border (dash-dot line; shifted slightly up or down in FIG. 2 for reasons of clarity), cell 2 has additional horizontal connecting lines (gate connecting lines) 3.5-3.9 (cf. FIG. 3), which will still be explained in greater detail hereinafter. These connecting lines also extend beyond the cell border into an adjacent similar cell, without the creation of a separate connection being necessary.

As already mentioned, in the layout of cell 2 or a correspondingly produced semifinished product for semiconductor components, certain connections are optionally prepared for a terminal but not contacted at first. The missing connections depend on a position of the individual element to be connected, here therefore transistor M, in a field formed by structurally identical, i.e., similar cells 2 and are effected at a higher (layout) hierarchical level by vias.

Figure 3:
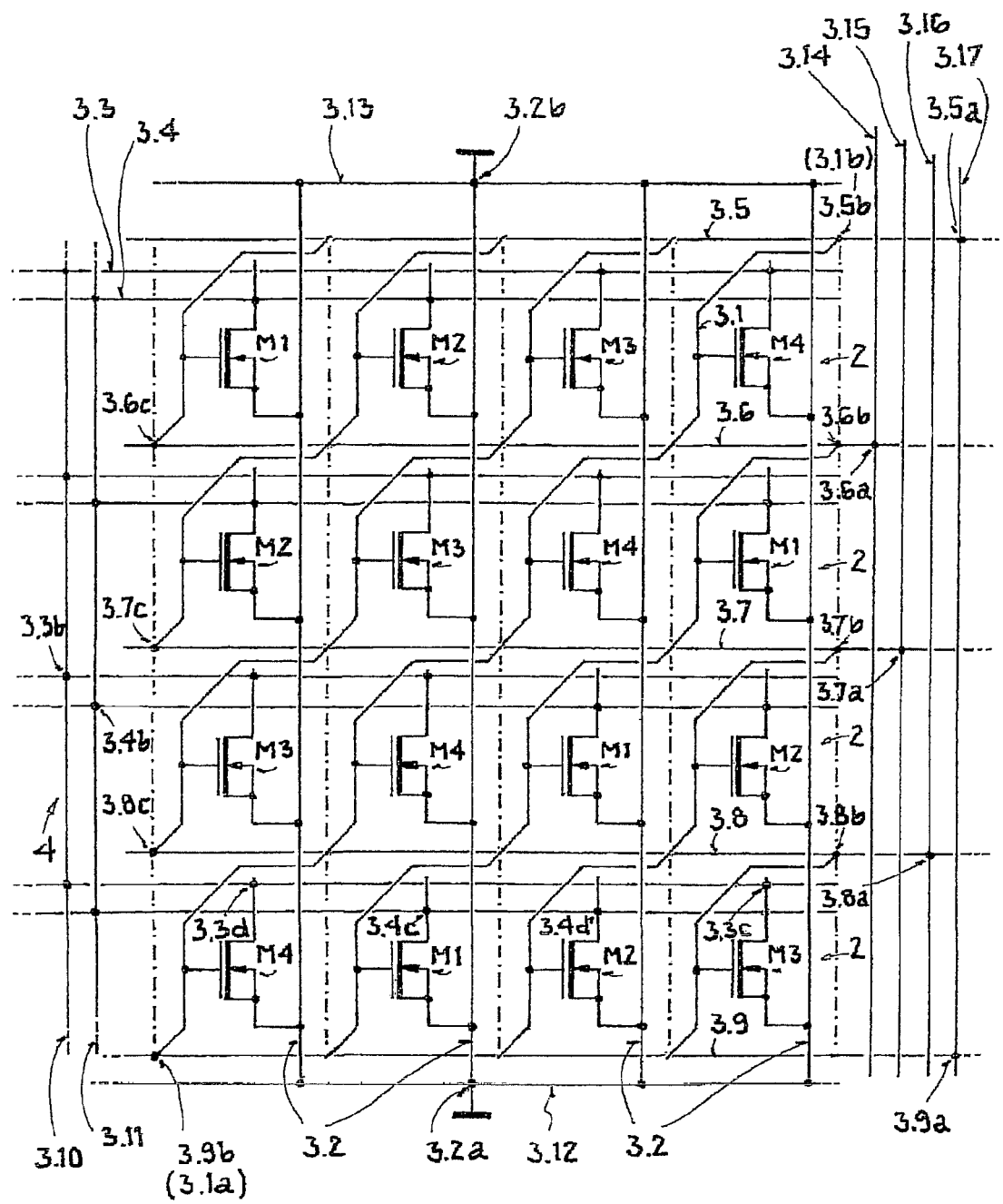
FIG. 3 shows a topological scheme of routing through a field of transistors, as semiconductor elements, formed of cells according to FIG. 2.

FIG. 3 shows a topological scheme of routing through a field 4, formed of cells according to FIG. 2, of transistors M1-M4 as semiconductor elements, whereby four transistors (one transistor each per cell) are connected in parallel. A matrix-like arrangement of structurally basically identical cells 2 is shown (cf. FIG. 2), of which only a few are explicitly designated in FIG. 3 for reasons of clarity. Cells 2 in FIG. 3 are again provided with dot-dash boundaries, whereby here, however, the likewise horizontal boundary lines of cells 2 are not evident because of the provision of the additional horizontal (gate) connecting lines 3.5-3.9 precisely between cells 2. Connecting lines 3.5-3.9 are each topologically represented by two layout elements each (cells); i.e., a corresponding coverage/overlapping occurs with the vertical alignment of the cells.

In FIG. 3, in each case, four cells 2 or the corresponding semiconductor elements (single elements), according to the illustration in FIG. 1, are connected to form an amplifier input stage, for which reason at certain locations in the topology, identifiable in the illustration in FIG. 2, the already discussed optional (via) connections were realized. These are also marked in FIG. 3 with black dots. The reference characters in FIG. 3 otherwise correspond to those in FIG. 1 and FIG. 2.

As can be derived particularly from FIG. 3, the second, vertical connecting lines 3.2 extend through or over all cells 2 of a column of field 4. Furthermore, the horizontal third and fourth connecting lines 3.3, 3.4 of each cell 2 extend over all cells 2 of a row of field 4. To the side of field 4, connecting devices are provided in the form of other connecting lines 3.10-3.17, as will be discussed in greater detail hereinafter: Connecting line 3.10 connects the third connecting lines 3.3 to output O2 by means of respective connections (vias) 3.3$b$, of which only one is explicitly designated for reasons of clarity. Connecting line 3.11 connects the fourth connecting lines 3.4 to output O1 by means of respective connections (vias) 3.4$b$, of which only one is explicitly designated for reasons of clarity. Connecting line 3.12 connects the second connecting lines to the shielding and reference potential GND (ground) by means of respective connections (vias) 3.2$a$, of which again only one is explicitly designated for reasons of clarity. Similarly, connecting line 3.13 via corresponding connections (vias) 3.2$b$ connects the second connecting lines 3.2 with the shielding and reference potential GND. Connecting lines 3.14-3.17 via corresponding connections (vias) with the connecting lines 3.5-3.9, which will still be discussed in greater detail hereinafter, provide for a functional signaling connection to inputs I1-I4.

In the present case, the semiconductor elements (transistors M1-M4) of each row of the matrix or field 4 in each case form an input stage 1 according to FIG. 1. By way of example, reference is made hereinafter primarily to the lowest row of field 4.

The mutual source/bulk terminals of transistors M1-M4 are connected to the ground potential GND via second connecting lines 3.2 and connections 3.2$a$, 3.2$b$ and via connecting lines 3.12, 3.13. The drain terminals of transistors M1, M2 of the two middle cells 2 are connected via connections (vias) 3.4$c$ or 3.4$d$ to the associated fourth connecting line 3.4 and thereby via connection 3.4$b$ via connecting line 3.11 to output O1. Furthermore, the drain terminals of transistors M3, M4 of the outer cells 2 are connected via connections (vias) 3.3$c$ or 3.3$d$ to the associated third connecting line 3.3, so that a connection to output O2 results via the additional connection 3.3$b$ and connecting line 3.10. The diagonal first connecting line 3.1, which continues, according to the second to fourth connecting lines 3.2-3.4, in a diagonal direction from cell 2 to cell 2 through field 4, provides for the connection of the gate terminals of transistors M1-M4 with the respective inputs I1-I4 according to FIG. 1, in the embodiment according to FIG. 3, without a separate connection being necessary for this. It is noted in this regard that the mentioned optional terminals 3.1$a$, 3.1$b$ according to FIG. 2 are used only for the vertical connection of the first connecting line to the overlying or underlying metal levels.

According to FIG. 3, input I1 is connected to connecting line 3.6 via a connection (via) 3.6$a$ proceeding from connecting line 3.14. From there, via another connection (via) 3.6$b$, the connection to the first connecting line 3.1 is created that connects the gate terminals of three transistors M1 arranged diagonally in field 4 one behind the other down to the lowest row of field 4. Another connection (via) 3.6$c$ contacts the first connecting line 3.1 of the last remaining transistor M1 (top left in field 4). Accordingly, transistors M2 are connected to input I2 via connecting lines 3.15 and 3.7 and connections (vias) 3.7$a$-$c$. The same also applies to transistors M3 in relation to input I3 (connecting lines 3.16 and 3.8 with connections (vias) 3.8$a$-$c$) and to transistors M4 in relation to input I4 (connecting lines 3.17 and 3.5/3.9 with connections (vias) 3.5$a$/3.9$a$ and 3.5$b$/3.9$b$). In this case, the connections 3.N$b$, 3.N$c$ (N=5, . . . , 9) correspond to the optional connections 3.1$a$,$b$ in FIG. 2.

As the person skilled in the art realizes, the arrangement of connecting lines 3.1-3.4 in cells 2 requires a permutation of transistors M1-M4 from row to row or column to column in field 4. It is emphasized, however, that all cells 2 are basically constructed the same, i.e., by their type, particularly as regards the course, number, and dimensioning of all connecting lines. The different functionality (differentiation by transistors M1-M4) of the semiconductor elements, present in the respective cells 2, results solely by the provision of the indicated connections 3.N$m$ (N=1, . . . , 9, m=a, . . . , d).

In particular, according to FIG. 3 the connecting networks for outputs O1 and O2 (connecting lines 3.3, 3.4) run similarly over all cells 2, so that the uniformity of parasitic capacitors C1 (cf. FIG. 1) is present, as required.

Figure 4:
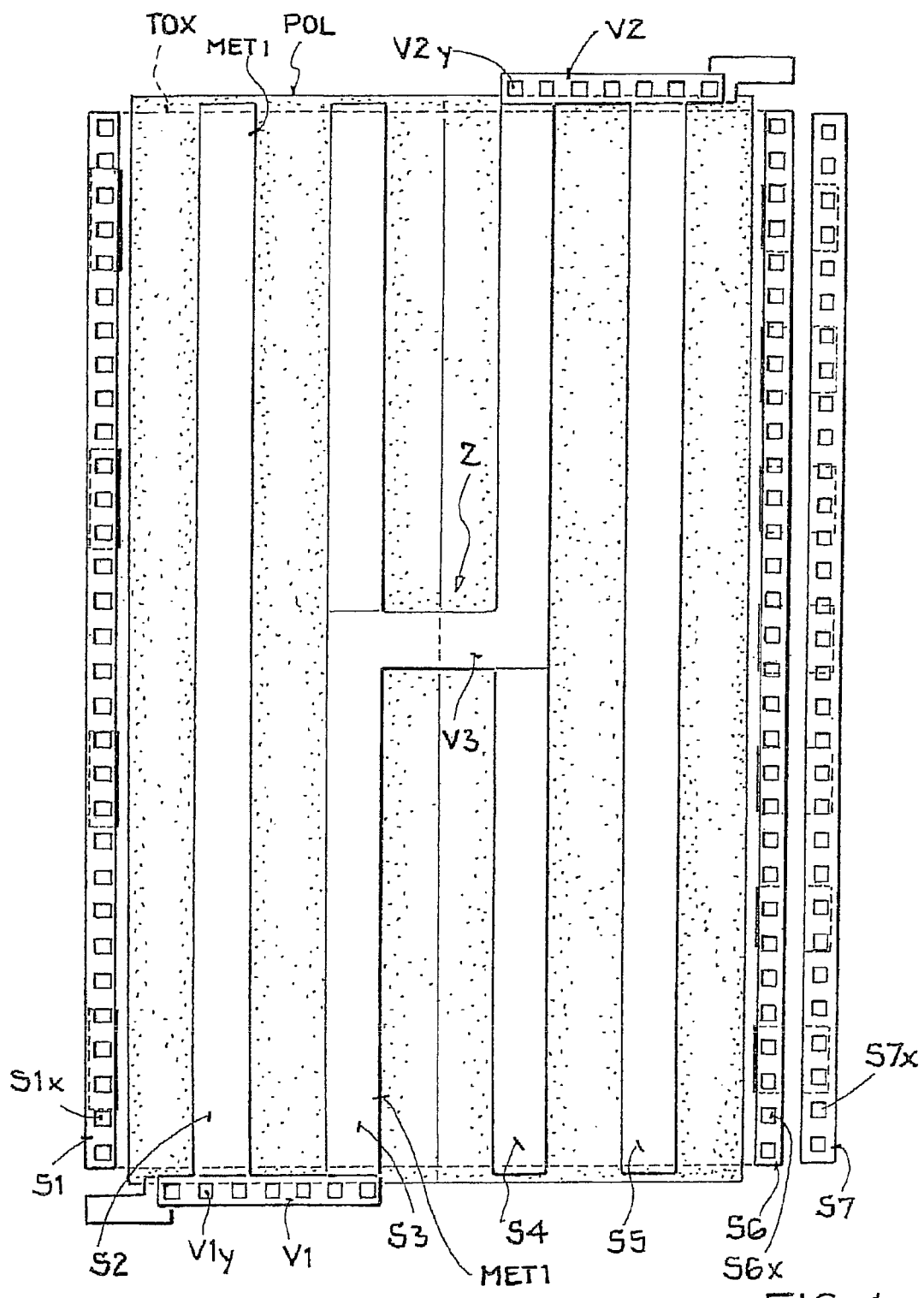
FIG. 4 shows a first horizontal section of a layout for a transistor as a semiconductor element.

FIG. 4 shows a first horizontal section of a layout for a semiconductor element M in a semiconductor component of the invention. The present described exemplary embodiment relates again to a layout for a layer sequence, to be realized subsequently, for the manufacture of a transistor M (cf. FIG. 2) for an amplifier input stage 1 (cf. FIG. 1). A layout of a semiconductor component or a semiconductor structural element is a design for the masks to be used for the manufacturing process, whereby inversions (positive-negative, dark-clear, etc.) result routinely from the layout via the mask technology for the fabrication.

It is noted here furthermore that the term "arranged" is used hereinafter generalized for the formation of the layers, regardless of whether the specific description relates to precisely, i.e., physically realized layers or only to planned structures within a layout.

The rectangle (mask) designated by TOX in FIG. 4 represents the active areas of the transistor (drain, channel, source). A thick oxide (TOX) is grown around this area. A thin oxide, the later gate oxide, is generated within the area. Polysilicon is deposited over this and patterned according to the mask designated by POL. The thin oxide regions projecting below the polysilicon are etched free and implanted by using masks NPI and PPI (not shown in the figure). The latter areas are generally designated as active regions (P-active, N-active) and form the drain, source, and bulk terminal of the transistor (see below). The first metal structures are arranged as traces on the polysilicon. The first metal structures are formed substantially as strips S1-S7 running parallel to one another, whereby strips S2-S5 are made longer and broader than strips S1, S6, and S7.

Strips S1-S7 are arranged above the gate oxide layer and strips S2-S5 in addition also above the polysilicon layer. Strips S2 and S3 are connected at their one end by means of a connecting structure V1, running transverse to the extension of strips S1-S7 and made of the metal of the first metallization level, also called the first metal MET1 hereafter. This also applies to strips S4, S5, which are connected at their respective end, opposite to connecting structure V1, by means of a connecting structure V2 made of the first metal MET1, whereby connecting structure V2 also extends transverse to the extension of strips S4, S5. Furthermore, strips S3 and S4 are connected in a central area Z of the described layer arrangement by means of a connecting structure V3, which is formed also in the first metal MET1 and extends transverse to an extension of strips S3, S4.

In the area of strips S1, S6, and S7 and in the area of connecting structures V1 and V2, in each case a plurality of contact holes S1$x$, S6$x$, S7$x$, V1$y$, V2$y$ ($x=1, \ldots, 31$; $y=1, \ldots, 7$) of a contact level are arranged one next to another in the extension direction of the particular strip or the particular connecting structure. Contact holes S1$x$, S6$x$, S7$x$, V1$y$, V2$y$ extend from the first metal MET1, depending on the function, down to an active area (not shown) or to the polysilicon and are filled with a conductive material, such as silicide, gold, copper, tungsten, or the like.

Connecting structures V1 and V2 together with strips S3 and S4 and the central connecting structure V3 form a diagonally running gate terminal (cf. connecting line 3.1 in FIGS. 2 and 3). Accordingly, contacting of the polysilicon occurs by means of the contact holes V1$y$, V2$y$. Contact holes S1$x$, S6$x$, and S7$x$ in strips S1, S6, and S7 are routed through the oxide down to the substrate or its active regions (not shown), whereby strip S1 functions as the drain terminal, strip S6 as the source terminal, and strip S7 as the bulk terminal.

Figure 5:
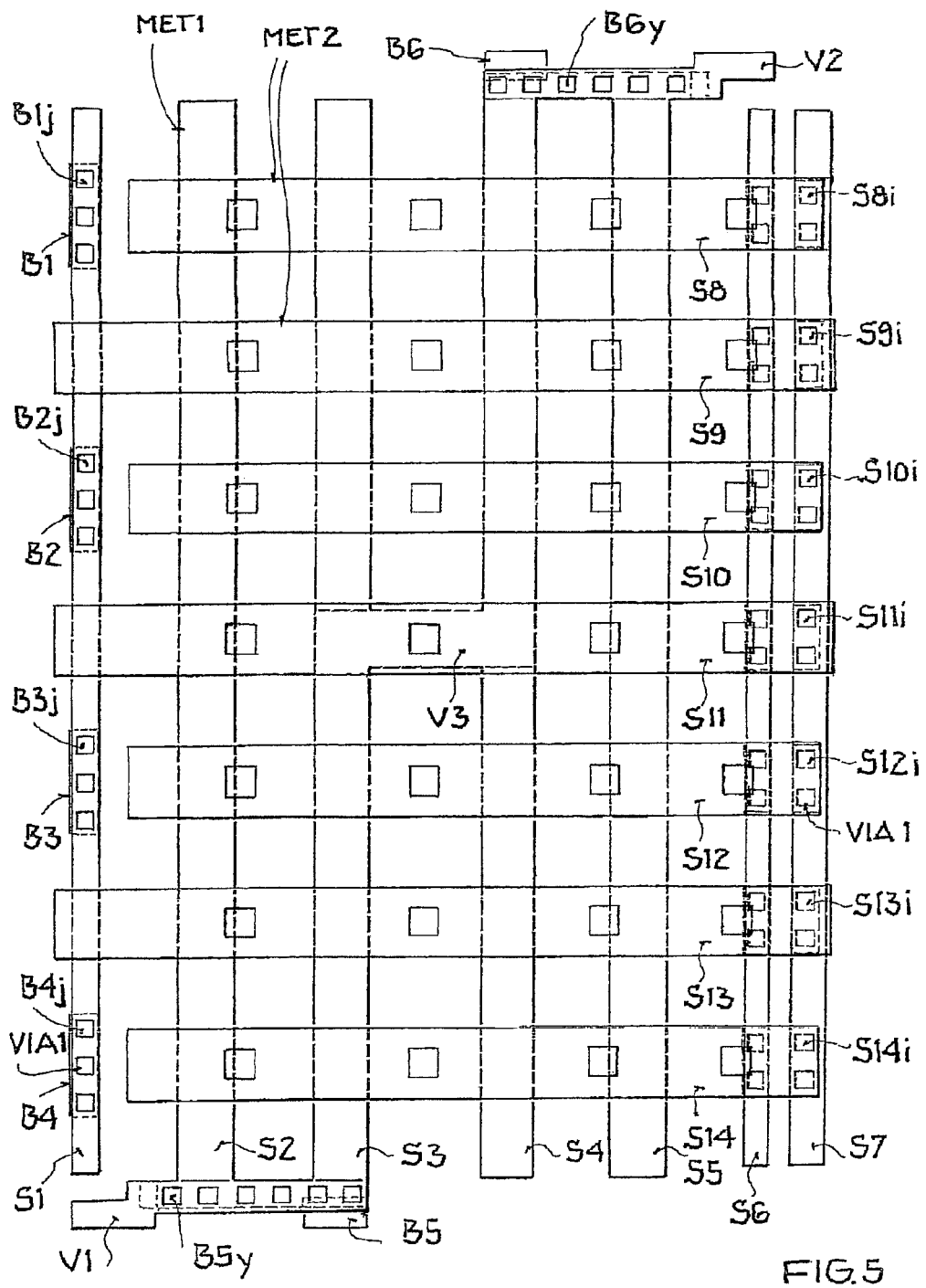
FIG. 5 shows a second horizontal section of a layout for a transistor as a semiconductor element.

FIG. 5 shows a second horizontal section of a layout for a matching structure. For reasons of clarity, the traces of the first metal MET1, which were already explained with reference to FIG. 4, are again shown in FIG. 5. A plurality of equidistantly arranged strips S8-S14 of the same width, each extending parallel to one another, of a second metal of the second metallization level MET2—hereafter also called second metal MET2—are arranged transverse to strips S1-S7, according to FIG. 4, in the overlying layer according to FIG. 5. In this case, strips S8-S14 always have alternatingly different longitudinal extensions:

Thus, strips S8, S10, S12, and S14 extend beginning above strip S7 into the area between strips S1 and S2, whereas the intermediate strips S9, S11, and S13 extend proceeding from strip S7 beyond strip S1 and thereby even project slightly above strip S7. Strip S11 runs above connecting structure V3. In the area of strips S8-S14 above strips S6 and S7, two vias each (VIA1) S8$i$-S14$i$ ($i=1, 2, 3, 4$) are provided down to the first metal MET1 (cf. FIG. 4). Furthermore, in the lengthening of the shorter strips S8, S10, S12, and S14 of the second metal MET2 above strip S1, areas B1-B4 of the second metals MET2 are arranged, which have vias (VIA1) B1$j$-B4$j$ ($j=1, 2, 3$) to the first metal MET1 of strip S1. Furthermore, additional areas B5, B6 of the second metal MET2 are provided in the area of connecting structures V1, V2 (cf. FIG. 4) in the lengthening of strip S3 or S4.

At least, the previously described strips S8, S10, S12, and S14 are used via the vias S8$i$, S10$i$, S12$i$, and S14$i$ as source/bulk terminals, whereas areas B1-B4, which are connected through vias B1$j$-B4$j$ with the drain bar (strips S1), function as drain terminals. Areas B5 and B6, in contrast, represent corresponding gate terminals. Areas B5 and B6 of the second metal MET2 are connected by vias B5$y$ or B6$y$ to the underlying metal layer MET1 in the area of the first and second connecting structures V1, V2. Strips S9 and S13 are connected to a reference potential (ground).

Areas B5 and B6 of the second metal MET2 are formed substantially L-shaped, whereby a leg of the L, which extends in the top plan view in the lengthening of strip S3 or S4 of the first metal MET1, is much shorter than the respective other leg of the L.

Figure 6:
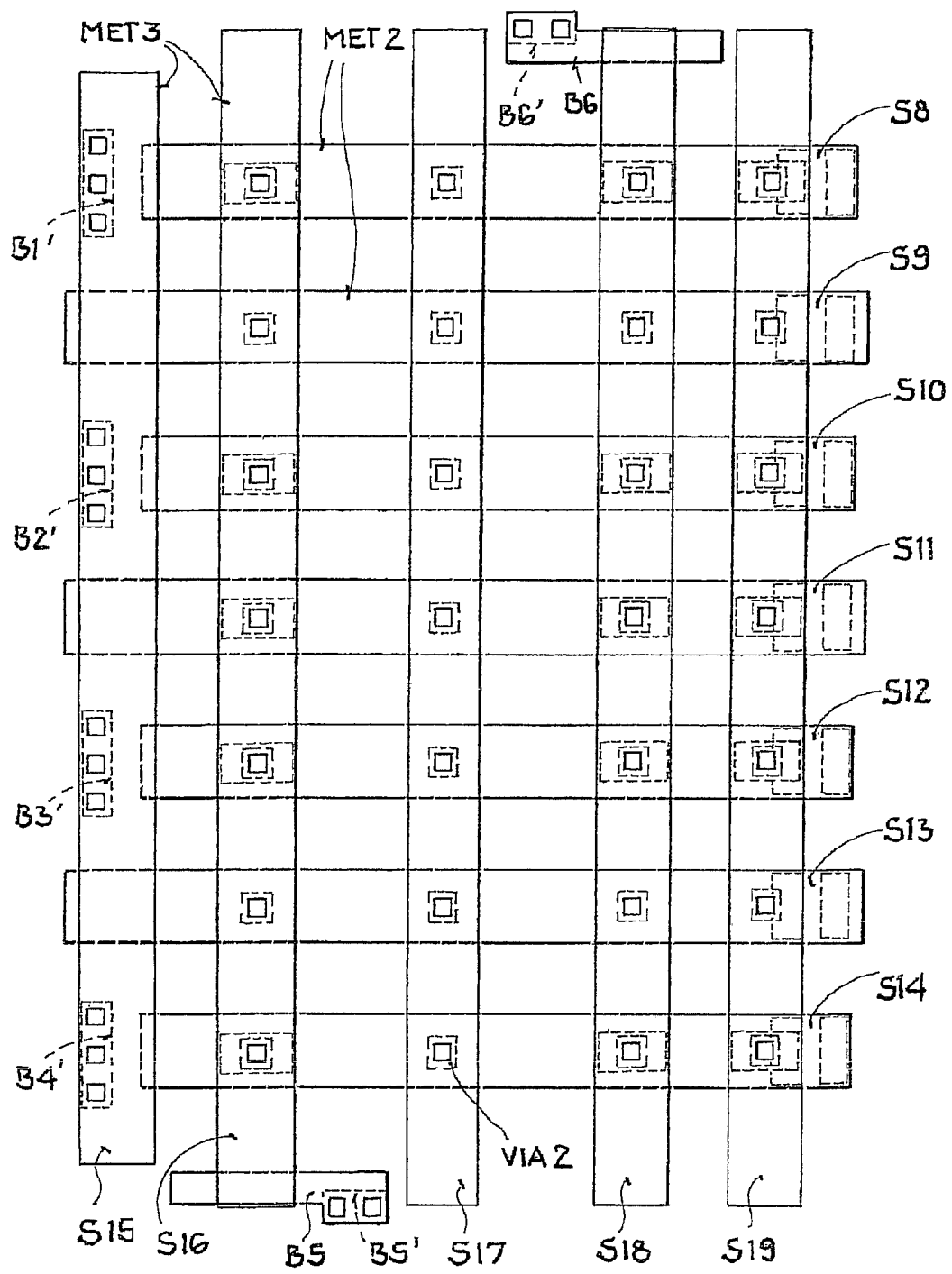
FIG. 6 shows a third horizontal section of a layout for a transistor as a semiconductor element.

FIG. 6 shows a third horizontal section of a layout for matching structure 1. On the shown level, a number of strips S15-S19 are arranged on a third metal of the third metallization level—also called metal MET3 hereafter—, whose course is parallel to that of strips S1-S7 of the first metal MET1 (cf. FIGS. 4 and 5). Strips S15-19 are made slightly broader than strips S8-S14 from the second metal MET2 and considerably broader than strips S1-S7 on the first metal MET1 (cf. FIG. 4), particularly considerably broader than strips S1-S6 and S7. Strip S15 runs shifted above strip S1, strip S16 overlaps in part strip S2, and strip S17 runs in the middle between strips S3 and S4. Strip S18 in part overlaps strip S5, and strip S19 runs shifted above strip S6. Strip S15 is formed shorter than strips S16-S19. At the crosspoints of strips S16-S19 with the underlying strips S8-S14 of the second metal MET2, via connections VIA2 are provided, which are designated only by way of example in FIG. 6. Furthermore, areas B5', B6' of the third metal MET3 are provided, which are arranged substantially above the short leg of the L-shaped areas B5, B6 of the second metal MET2. In areas B5', B6' as well, there are via connections VIA2 from the third metal MET3 to the second metal MET2. There are other via connections VIA2 in the area of strip S15 in the lengthening of the underlying strips S8, S10, S12, and S14 of the second metal MET2.

Strip S15 functions in this manner as a drain bar, whereas strips S16-S19 function as a source/bulk terminal and areas B5' and B6' as a gate terminal.

Figure 7:
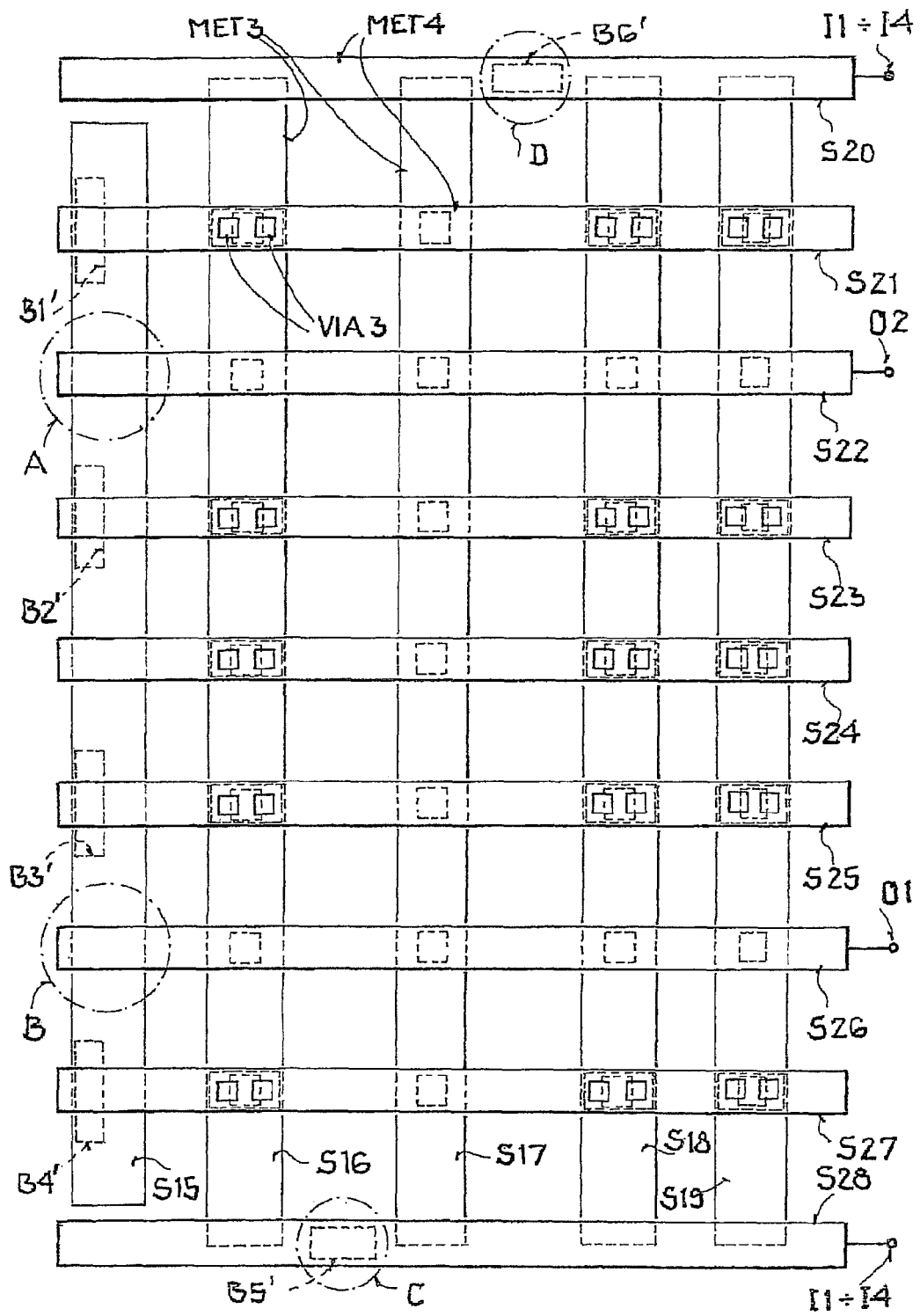
FIG. 7 shows a fourth horizontal section of a layout for a transistor as a semiconductor element.
Figure 8:
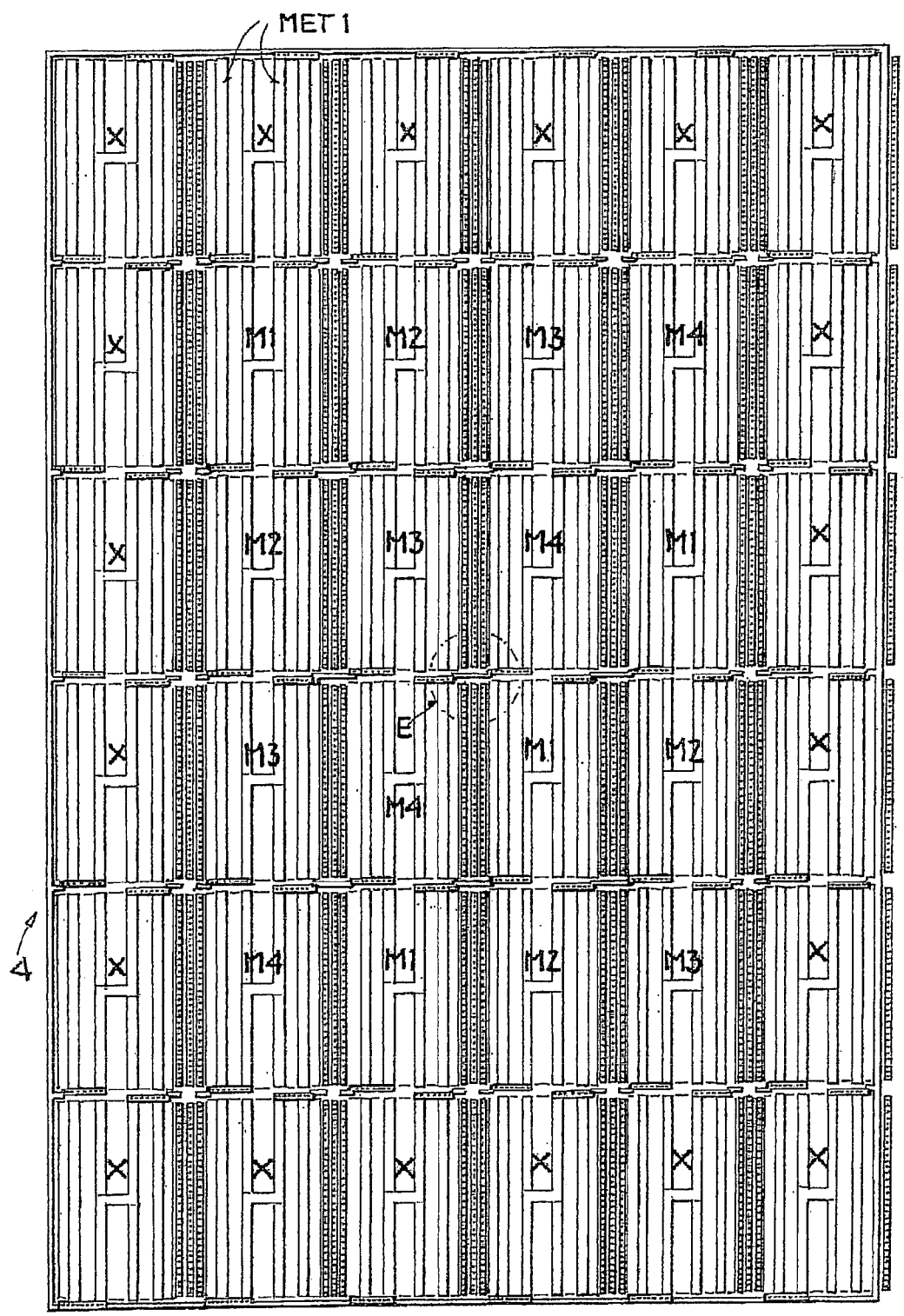
FIG. 8 shows a first horizontal section through a layout for an arrangement of transistors as semiconductor elements according to FIGS. 4 to 7.

FIG. 7 shows a fourth horizontal section of a layout for a matching structure in a semiconductor circuit as a semiconductor component. A regular metal structure is created at this level by regularly spaced strips S20-S28 of a fourth metal of a fourth metallization level MET4—called a fourth metal MET4 hereafter—, which run transverse to the underlying strips S15-S19 of the third metal MET3. Strips S20-S28 of the fourth metal MET4 extend in each case over the entire area occupied by strips S15-S19 of the third metal MET3. Strips S21, S23, S24, S25, and S27 are connected via pairs of via connections VIA3 each to the underlying strips S16, S18, and S19. Strips S20, S28 extend above the areas B6' or B5' (cf. FIG. 6) of the third metal MET3; they correspond to the connecting lines 3.5-3.9 in FIGS. 2 and 3. Strips S21-S27 run above strips S8-S14 of the second metal MET2 (cf. FIG. 5). In this case, strips S21, S23, S25, and S27 are lengthened beyond the extension of strips S8, S10, S12, and S14 to above areas B1'-B4' of the third metal MET3, which are arranged above areas B1-B4 of the second metal (cf. FIG. 5).

Strips S21, S23-S25, and S27 form the source/bulk terminal for the semiconductor component to be created (transistor). In this case, the structure described using FIGS. 4 to 7 is to be regarded initially still as a type of semifinished product, whose final function is determined by the creation of optional additional terminals in the area of strips S20, S22, S26, or S28. With reference to the illustration in FIG. 1 or FIG. 3, in the area of strip S22 the drain terminal of the transistor to be created can be connected to output O2 in area A by means of another via connection VIA3. Alternatively, in the area of strip S26 in the case of B a drain terminal can be created by means of another via connection VIA3, so that the drain terminal of the transistor is connected to output O1. By means of optional gate terminals via additional via connections VIA3 in the area C or D, the transistor can be connected further with its gate terminal to one of the inputs I1-I4. The alternative drain connecting lines S22, S26 lie above the MET2 strip S9 or S13 connected to the reference potential (cf. FIGS. 5 and 6), and are thus shielded from the underlying gate (cf. FIG. 4). For this reason, strips S9 and S13 are made broader than strips S22 and S26.

In other words: The structure described with FIGS. 4 to 7 can be used similar to cell 2 in FIG. 2 to form a field 4 of semiconductor elements according to FIG. 3, in that by optional creation of additional (via) connections according to FIG. 7 (areas A-D), similar semiconductor elements can be connected together to form semiconductor components, which meet the highest matching requirements. This is achieved by uniform covering of the surface with metal strips of all layers, as a result of which a homogeneous coverage of the surface with strips of all metal layers is achieved; the degree of coverage required per layer of, for example, 30-70% is achieved, without costly metal fillings having to be performed afterwards.

FIGS. 8 to 11 each show a horizontal section through a layout for an arrangement of semiconductor elements according to FIGS. 4 to 7. Shown is the arrangement of structures according to FIGS. 4 to 7 with the arrangement in a field 4 according to FIG. 3. The individual structures according to FIG. 4 to 7—as already mentioned—represent individual cells 2 according to FIG. 3, whereby the individual cells are designated by M1-M4 in FIG. 3 according to the semiconductor components (transistors) provided by them. The cells designated by M1-M4 are surrounded by a frame-like arrangement of dummy cells, labeled with "X", which are used for reasons of symmetry, particularly for feeding out of lines (connection to the ground potential GND, inputs I1-I4, and outputs O1-O2). The dummy cells are used to create a topologically identical environment for all elements and have the same structure as these apart from the vias.

As shown or emphasized in the case of E by way of example, the gate terminals of the transistors of the same type, i.e., M1 or M2 or M3 or M4, are connected by the first metal MET1 (cf. FIG. 4) diagonally through field 4 (cf. FIG. 3; connecting line 3.1).

Figure 9:
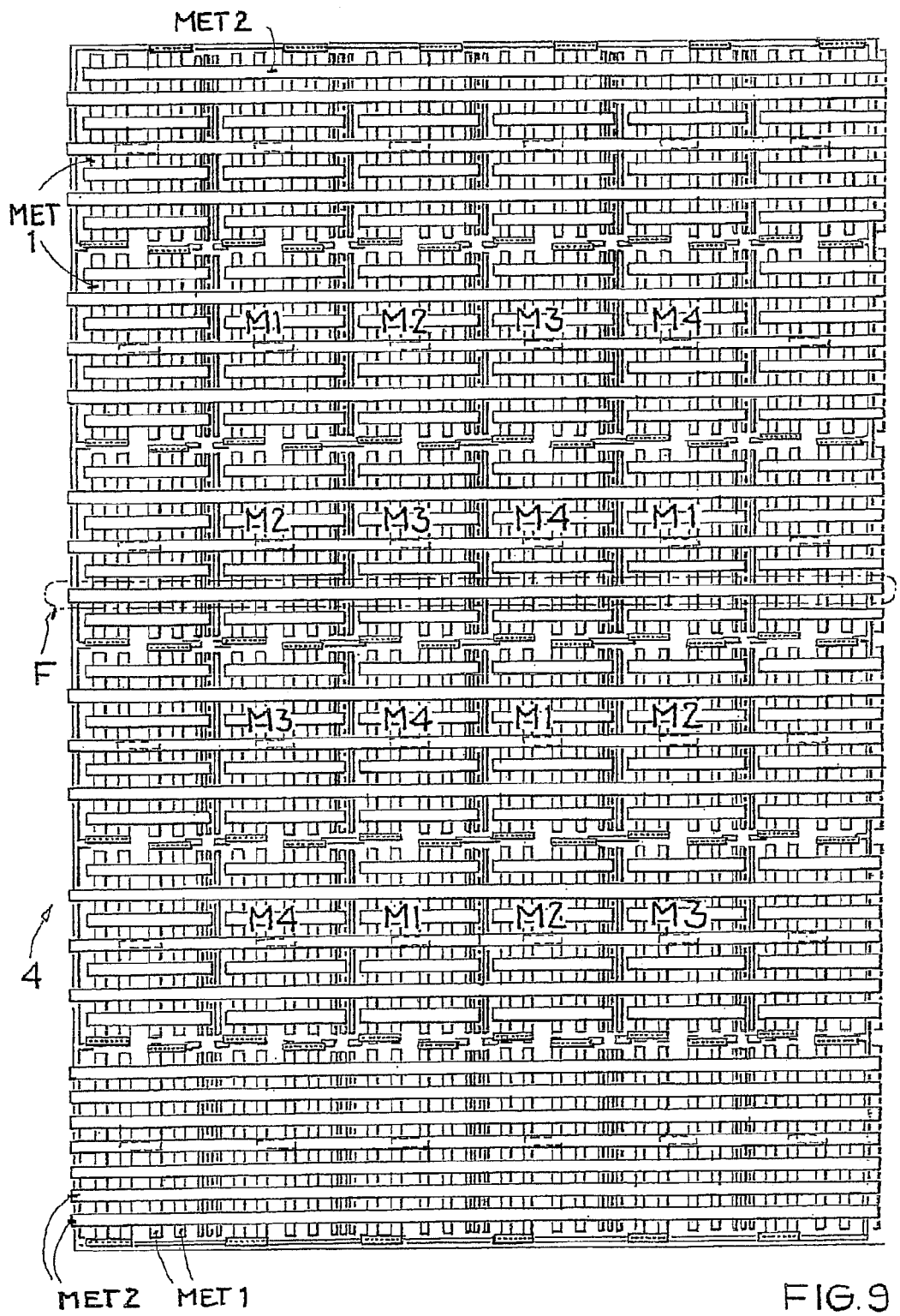
FIG. 9 shows another horizontal section through a layout for an arrangement of transistors as semiconductor elements according to FIG. 8.

FIG. 9 shows in the case of F by way of example the connection of source and bulk terminals of a row via the second metal MET2 (cf. connecting lines 3.2 in FIGS. 2 and 3).

Figure 10:
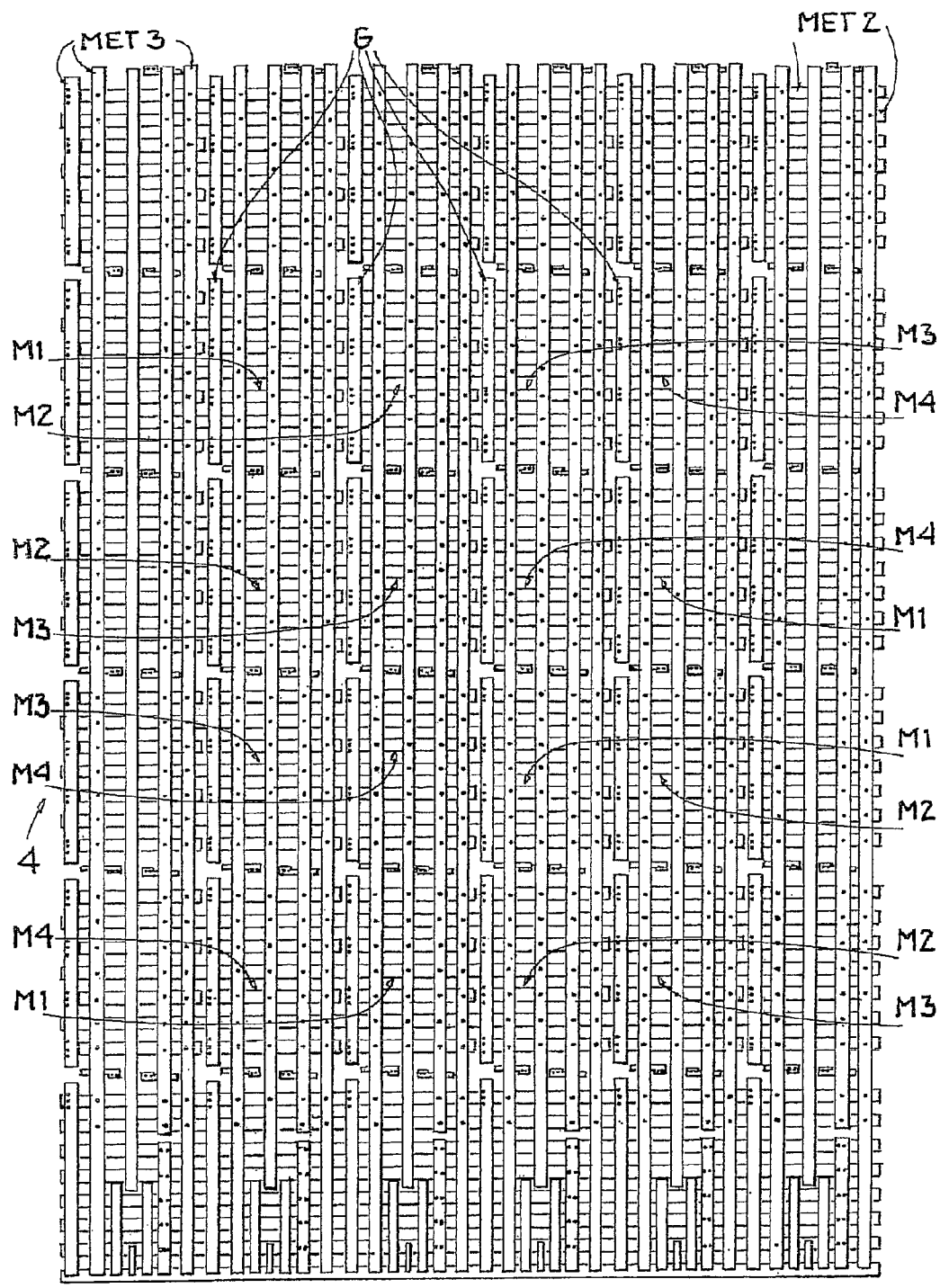
FIG. 10 shows another horizontal section through a layout for an arrangement of transistors as semiconductor elements according to FIG. 8.

FIG. 10 illustrates in the case of G by way of example drain terminals made in the third metal MET3 (cf. connecting lines 3.3, 3.4 in FIGS. 2 and 3).

Figure 11:
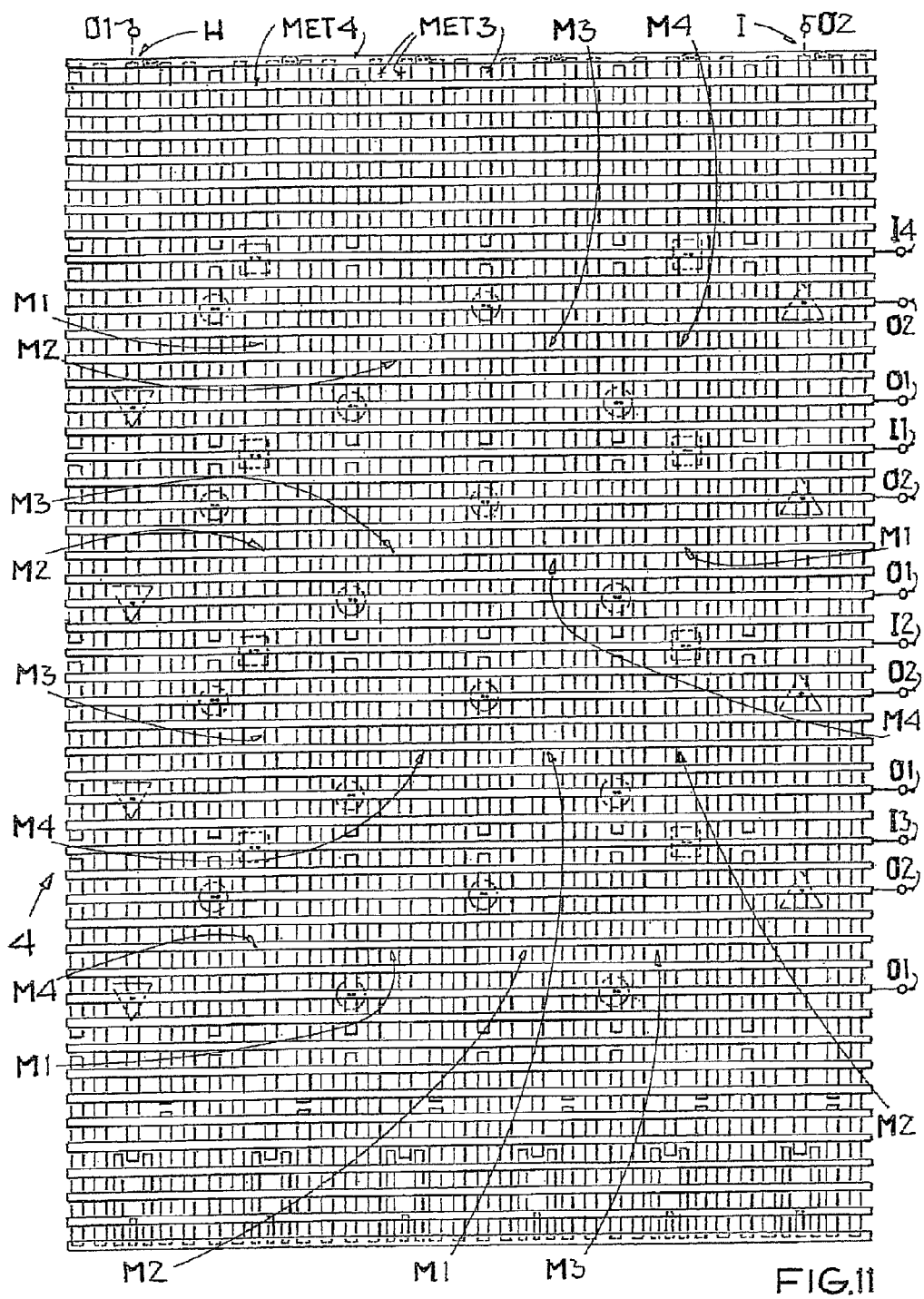
FIG. 11 shows another horizontal section through a layout for an arrangement of transistors as semiconductor elements according to FIG. 8.

FIG. 11 shows, at the locations marked with squares, the connection of the gate lines by means of via connections VIA3 to inputs I1-I4. These correspond to connections 3.5$x$-3.9$x$ ($x$=a, b, c) in FIG. 3. The terminals of the outputs (drains) are realized by means of via connections VIA3 at the locations marked with a circle. These correspond to connections 3.4$c$, 3.4$d$ for output O1 or 3.3$c$, 3.3$d$ for output O2 as shown by way of example in FIG. 3. Groupings of output lines (corresponding to lines 3.10 and 3.11 in FIG. 3) are depicted in FIG. 11 for H (for output O1) or I (for output O2). Connections corresponding to connections 3.3$b$, 3.4$b$ in FIG. 3 (also by means of via connections VIA3) are marked in FIG. 11 with inverted triangles (for output O1) or upright triangles (for output O2).

In this way, the present invention creates a method for the designing and subsequent manufacture of individual semiconductor elements or assembled semiconductor components, which are formed in a field of particularly the same semiconductor elements. The described method therefore can be used not only in the planning phase for the creation of suitable layouts for semiconductor elements or components, for example, as part of computer-aided or software-based layout methods, but is used—by generation of suitable layout data or mask data—moreover, also as the manufacturing process for the actual manufacture of semiconductor components of this type within the scope of otherwise known standard processes, as described in detail above.

The cell structure according to FIG. 2 or FIGS. 4 to 7 or a field made up of such cells according to FIG. 3 or FIGS. 8 to 11 can also be used as a semifinished product for the subsequent manufacture of semiconductor components and utilized economically.

The layout process or a manufacturing process based thereon according to the exemplary embodiment particularly of FIG. 2 guarantees topographic uniformity of all trace geometries from transistor to transistor in one and the same metallization level for at least the lowest metallization levels and is thereby suitable for also meeting the highest matching requirements. In synergy, the requirements relative to the parasitics (parasitic capacitors and/or parasitic inductors) of all lines can also be fulfilled optimally. The minimum thickness of all traces (for example, 30-70% of the surface) as required by a certain process can be easily predefined and adhered to in a simple manner. With the elimination of manual wiring according to the exemplary embodiment of FIGS. 8 to 10, moreover, the creation of layouts is substantially facilitated, so that the design time and corresponding costs are reduced. The layout cells generated thereby according to the exemplary embodiment of FIGS. 4 to 7 can be evaluated again; i.e., they can be arranged to form any desired large fields for the generation of semiconductor circuits as semiconductor components.

As the person skilled in the art realizes, for semiconductor circuits other than the amplifier input stage shown here by way of example, e.g., for a digital-to-analog converter (DAC) operating with binary weighting, other and/or additional via connections, than shown in FIG. 11, may be necessary between the metallization levels. Moreover, the selected designation "first" to "fourth" metal does not necessarily mean that these must be physically/chemically different metals. Rather, at least a few of the metal levels are preferably made of a similar metal. It is also possible to provide additional metallization levels above the fourth metallization level, which can be wired manually or also automatically.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A semiconductor circuit comprising:
   a matching structure that has a plurality of transistors, whose structure is substantially similar to one another;
   metallization levels with geometrically formed traces that are formed directly above the transistors; and
   vias provided in via levels that are formed between two of the metallization levels,
   wherein within one and the same metallization level, a geometry of the traces above each transistor is formed substantially the same.

2. The semiconductor circuit according to claim 1, wherein the transistors of the matching structure are arranged adjacent to one another, and wherein within one and the same metallization level at least one trace of the geometry above a transistor adjoins at least one trace of a neighboring transistor to form a conducting connection.

3. The semiconductor circuit according to claim 1, wherein, at least within the lowest via level, a position of the vias is substantially the same relative to a structure of each transistor.

4. The semiconductor circuit according to claim 3, wherein in a third via level or in a via level above the third via level, a position of the vias relative to the structure of each transistor for connection of the transistors to one another is different.

5. The semiconductor circuit according to claim 1, wherein the geometry of the traces within at least one metallization level has a plurality of strips parallel to one another, particularly at an equidistant spacing.

6. The semiconductor circuit according to claim 1, wherein the matching structure has dummy transistors, which have a structure that resembles that of the transistors, wherein the dummy transistors are arranged at an edge of the matching structure, and wherein within one and the same metallization level, the geometry of the traces above each transistor and each dummy transistor is formed substantially the same.

7. The semiconductor circuit according to claim 1, wherein automatically arranged filling structures are provided only outside the matching structure between traces of the metallization levels.

8. The semiconductor circuit according to claim 7, wherein at least within one and the same metallization level outside the matching structure a first coverage ratio of traces and filling structures to free areas and a second coverage ratio of the geometry of the traces to free areas of the matching structure are within one and the same value range, particularly within the value range between 30% and 70%.

* * * * *